(12) United States Patent
Chiang et al.

(10) Patent No.: US 9,202,875 B2
(45) Date of Patent: Dec. 1, 2015

(54) HIGH ELECTRON MOBILITY TRANSISTOR WITH INDIUM NITRIDE LAYER

(71) Applicant: TAIWAN SEMICONDUCTOR MANUFACTURING COMPANY, LTD., Hsinchu (TW)

(72) Inventors: Chen-Hao Chiang, Jhongli (TW); Po-Chun Liu, Hsinchu (TW); Chi-Ming Chen, Zhubei (TW); Min-Chang Ching, Zhubei (TW); Chung-Yi Yu, Hsinchu (TW); Chia-Shiung Tsai, Hsinchu (TW); Ru-Liang Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/182,885

(22) Filed: Feb. 18, 2014

(65) Prior Publication Data

US 2015/0236101 A1   Aug. 20, 2015

(51) Int. Cl.
*H01L 29/20* (2006.01)
*H01L 29/778* (2006.01)
*H01L 29/66* (2006.01)
*H01L 21/18* (2006.01)
*H01L 31/18* (2006.01)

(52) U.S. Cl.
CPC ............ *H01L 29/2003* (2013.01); *H01L 21/18* (2013.01); *H01L 21/182* (2013.01); *H01L 29/66431* (2013.01); *H01L 29/66462* (2013.01); *H01L 29/7787* (2013.01); *H01L 31/18* (2013.01); *H01L 31/1848* (2013.01)

(58) Field of Classification Search
CPC ........ H01L 21/02; H01L 21/18; H01L 21/182; H01L 29/66431; H01L 29/66462; H01L 31/18; H01L 31/1848
See application file for complete search history.

(56) References Cited

U.S. PATENT DOCUMENTS

2011/0057232 A1*  3/2011  Sheppard et al. ............. 257/194

\* cited by examiner

*Primary Examiner* — Thanhha Pham
(74) *Attorney, Agent, or Firm* — Hauptman Ham, LLP

(57) ABSTRACT

A method comprises depositing a first layer comprising aluminum nitride over a substrate. The method further comprises depositing a second layer comprising aluminum gallium nitride over the first layer. The method also comprises depositing a third layer comprising indium gallium nitride over the second layer. The method additionally comprises removing some of the third layer leaving a first portion of the third layer and a second portion of the third layer. The method further comprises reducing an aluminum content of at least the first layer by drawing aluminum atoms from the first layer into at least the second layer beneath the first portion and the second portion of the third layer. The method also comprises depositing a source contact over the first portion of the third layer and a drain contact over the second portion of the third layer.

20 Claims, 3 Drawing Sheets

HIGH ELECTRON MOBILITY TRANSISTOR WITH INDIUM NITRIDE LAYER

BACKGROUND

Device manufacturers are challenged to deliver value and convenience to consumers by, for example, providing integrated circuits that provide quality performance. The performance capabilities of some integrated circuits are limited because of a resistance that exists between source and/or drain contacts, and one or more semiconductor layers of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
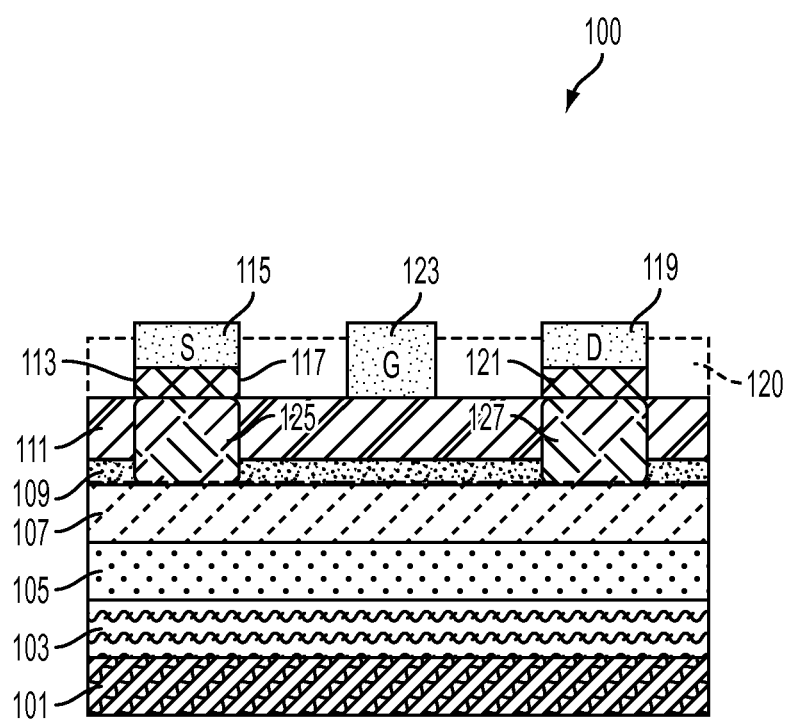
FIG. 1 is a cross-section view of a semiconductor device with a low band gap material beneath a source contact and a drain contact of the semiconductor device, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Semiconductor devices such as, but not limited to, high electron mobility transistors (HEMT's) often comprise a source contact, a drain contact, a substrate, and a plurality of layers between the source contact, the drain contact, and the substrate. Among these layers, some semiconductor devices include one or more of an aluminum gallium nitride layer and an aluminum nitride layer between the source and drain contacts and the substrate. These aluminum gallium nitride and aluminum nitride layers inhibit device performance capabilities because the aluminum gallium nitride layer and/or the aluminum nitride layer often have a high aluminum content that is greater than 25%.

Because the aluminum gallium nitride layer has a high aluminum content, the aluminum gallium nitride layer is a high band gap material. Additionally, the high aluminum content of the aluminum nitride layer makes the aluminum nitride layer a high impedance blocking layer. Accordingly, the high aluminum content causes one or more of a poor ohmic contact between the source and drain contacts and the at least one semiconductor layer, or poor two dimensional electron gas (2DEG) performance, which inhibits electron flow. As such, the high aluminum content in the aluminum gallium nitride layer and the aluminum nitride layer increases a resistance between the source and drain contacts and the at least one semiconductor layer, inhibiting device performance.

FIG. 1 is a cross-section view of a semiconductor device 100 with a low band gap material beneath a source contact and a drain contact of the semiconductor device 100, in accordance with one or more embodiments.

The semiconductor device 100 comprises a substrate 101, a first buffer layer 103 over the substrate 101, a second buffer layer 105 over the first buffer layer 103, a semiconductor layer 107 over the second buffer layer 105, an aluminum nitride layer 109 over the semiconductor layer 107, an aluminum gallium nitride layer 111 over the aluminum nitride layer 109, an indium gallium nitride layer 113 over the aluminum gallium nitride layer 111, a source contact 115 over a first portion 117 of the indium gallium nitride layer 113, a drain contact 119 over a second portion 121 of the indium gallium nitride layer 113, and a gate contact 123 between the source contact 115 and the drain contact 119. In some embodiments, the semiconductor device 100 optionally comprises a passivation layer 120 within which the source contact 115, drain contact 119 and gate contact 123 are deposited. In some embodiments, the semiconductor device 100 is a high mobility electron transistor.

A spacing within which the gate contact 123 resides separates the first portion 117 and the second portion 121 of the indium gallium nitride layer 113. The semiconductor device 100 also comprises a first blended region 125 beneath the first portion 117 of the indium gallium nitride layer 113 and a second blended region 127 beneath the second portion 121 of the indium gallium nitride layer 113.

The first blended region 125 and the second blended region 127 span at least the aluminum gallium nitride layer 111 and the aluminum nitride layer 109. The first blended region 125 and the second blended region 127 comprise aluminum atoms drawn from the aluminum nitride layer 109 into at least the aluminum gallium nitride layer 111. In some embodiments, the first blended region 125 and the second blended region 127 comprise indium atoms driven into at least the aluminum gallium nitride layer 111 from the indium gallium nitride layer 113. Driving the indium atoms from the aluminum gallium nitride layer 111 effectively replaces the high band gap material that is the aluminum gallium nitride layer 111, at least in the first blended region 125 and the second blended region 127, with a low band gap material, i.e., indium.

In some embodiments, the aluminum gallium nitride layer 111 comprises between about 15% and about 35% aluminum at least within the first blended region 125 and/or the second blended region 127.

In some embodiments, the indium gallium nitride layer 113 comprises between about 5% and about 20% indium. In other embodiments, the indium gallium nitride layer 113 comprises between about 9% and about 18% indium. In some embodiments, the indium gallium nitride layer 113 is an N-type doped material.

In some embodiments, the substrate 101 comprises one or more of a silicon, glass, polymer, metal, or other suitable material, the first buffer layer 103 comprises aluminum nitride, an oxide, a silicide, another nitride, or other suitable material, the second buffer layer 105 comprises aluminum gallium nitride, an oxide, a silicide, another nitride, or other suitable material. The first buffer layer 103 and the second buffer layer 105 have thicknesses that range between about 10 nm and about 200 nm.

In some embodiments, the semiconductor layer 107 comprises one or more materials other than aluminum such that the semiconductor layer 107 has 0% aluminum content. For example, the semiconductor layer 107 comprises gallium nitride, an oxide, a silicide, another nitride, or other suitable material. Though illustrated and discussed as one layer, the semiconductor layer 107, in some embodiments, the semiconductor layer 107 comprises two or more layers. For example, in some embodiments, the semiconductor layer 107 comprises a gallium nitride layer, and one or more aluminum nitride layers. If the semiconductor layer 107 comprises only gallium nitride, the semiconductor layer has a thickness ranging between about 0.5 micrometers to about 2 micrometers. If the semiconductor layer 107 comprises more than gallium nitride among one or more other layers, the one or more other layers that make up the semiconductor layer 107 individually have a thickness that ranges between about 10 nm and about 400 nm.

In some embodiments, the aluminum nitride layer 109 has a thickness ranging between about 1 nm and about 5 nm, the aluminum gallium nitride layer 111 has a thickness ranging between about 15 nm and about 30 nm, and the indium gallium nitride layer 113 has a thickness ranging between about 1 nm and about 5 nm.

In some embodiments, the source contact 115 and the drain contact 119 comprise an ohmic metal or alloy that comprises one or more of titanium, titanium disilicide, aluminum silicide, aluminum, titanium nitride, tungsten, molybdenum disilicide, platinum silicide, cobalt disilicide, tungsten disilicide, indium, gallium, palladium, gold, copper, tin, or other suitable material.

In some embodiments, the first blended region 125 and/or the second blended region 127 comprise atoms of at least one ohmic metal in the source contact 115 and/or the drain contact 119 driven into at least the aluminum gallium nitride layer 111 from the source contact 115 and/or the drain contact 119. For example, the first blended region 125 and/or the second blended region 127, in some embodiments, have titanium atoms driven into the aluminum gallium nitride layer 111 within the first blended region 125 and/or the second blended region 127.

Because the first blended region 125 and/or the second blended region 127 in the aluminum gallium nitride layer 111 comprise aluminum atoms drawn up from the aluminum nitride layer 109, the effective thickness of the aluminum nitride layer 109 is reduced compared to the aluminum nitride layer 109 before formation of the first blended region 125 and the second blended region 127. Also, because indium atoms driven into the aluminum gallium nitride layer 111 from the indium gallium nitride layer 113, the band gap of the aluminum gallium nitride layer 111 is lowered by the blending of indium atoms with the aluminum gallium nitride layer 111. The semiconductor device 100 having the first blended region 125 and the second blended region 127, accordingly, has a reduced resistance and improved ohmic performance between the source contact 115 and the drain contact 119 with the semiconductor layer 107 compared to conventional semiconductor devices.

Further, because some of the ohmic metal atoms of the source contact 115 and the drain contact 119 are driven into the aluminum gallium nitride layer 111 from the source contact 115 and the drain contact 119, the ohmic performance of the semiconductor device 100 is further improved because of the increased conductivity of the aluminum gallium nitride layer 111 on account of the addition of the ohmic metal atoms in the first blended region 125 and the second blended region 127.

Figure 2A:
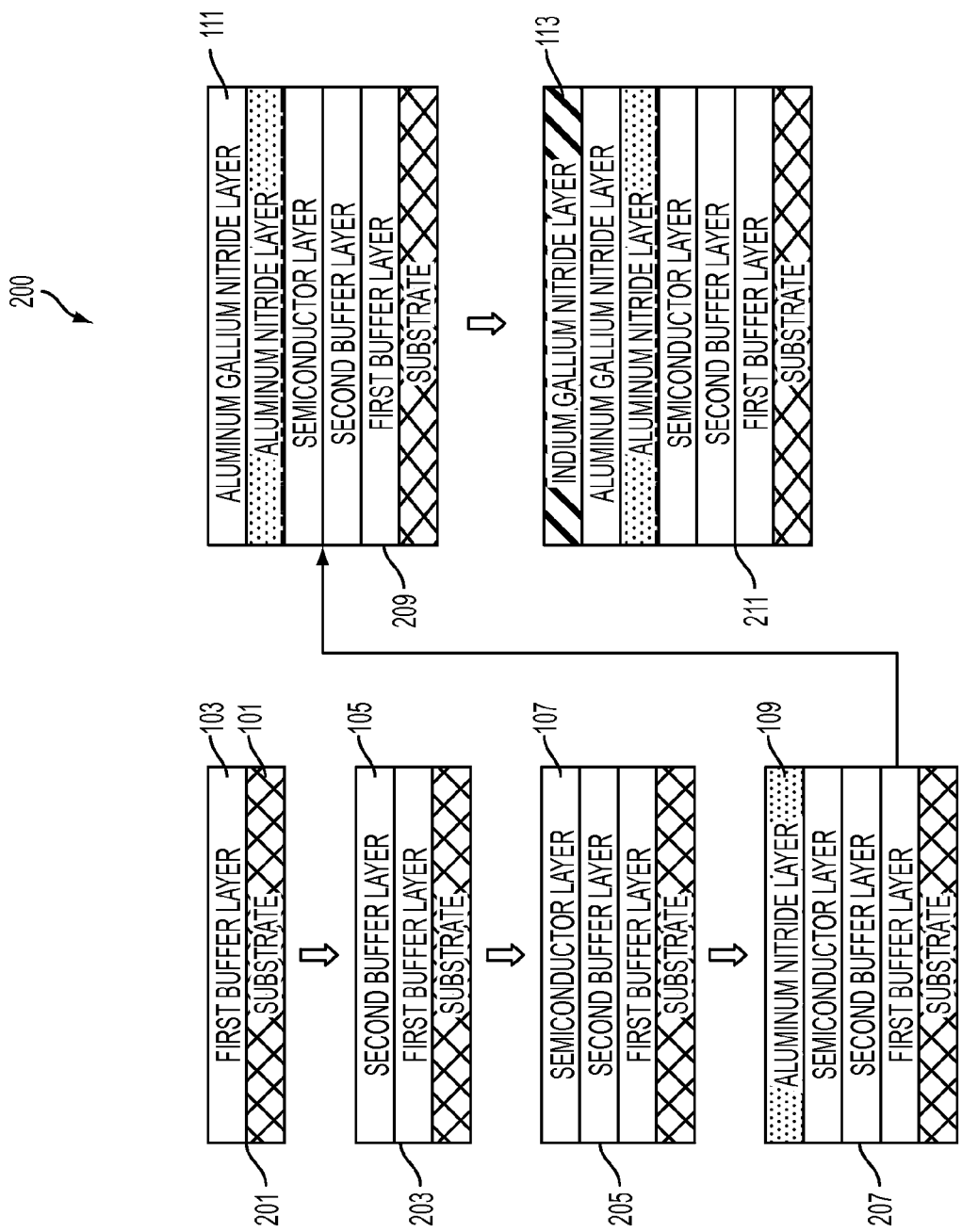
FIGS. 2a-2b are process diagrams of a method of manufacturing a semiconductor device, in accordance with one or more embodiments.
Figure 2B:
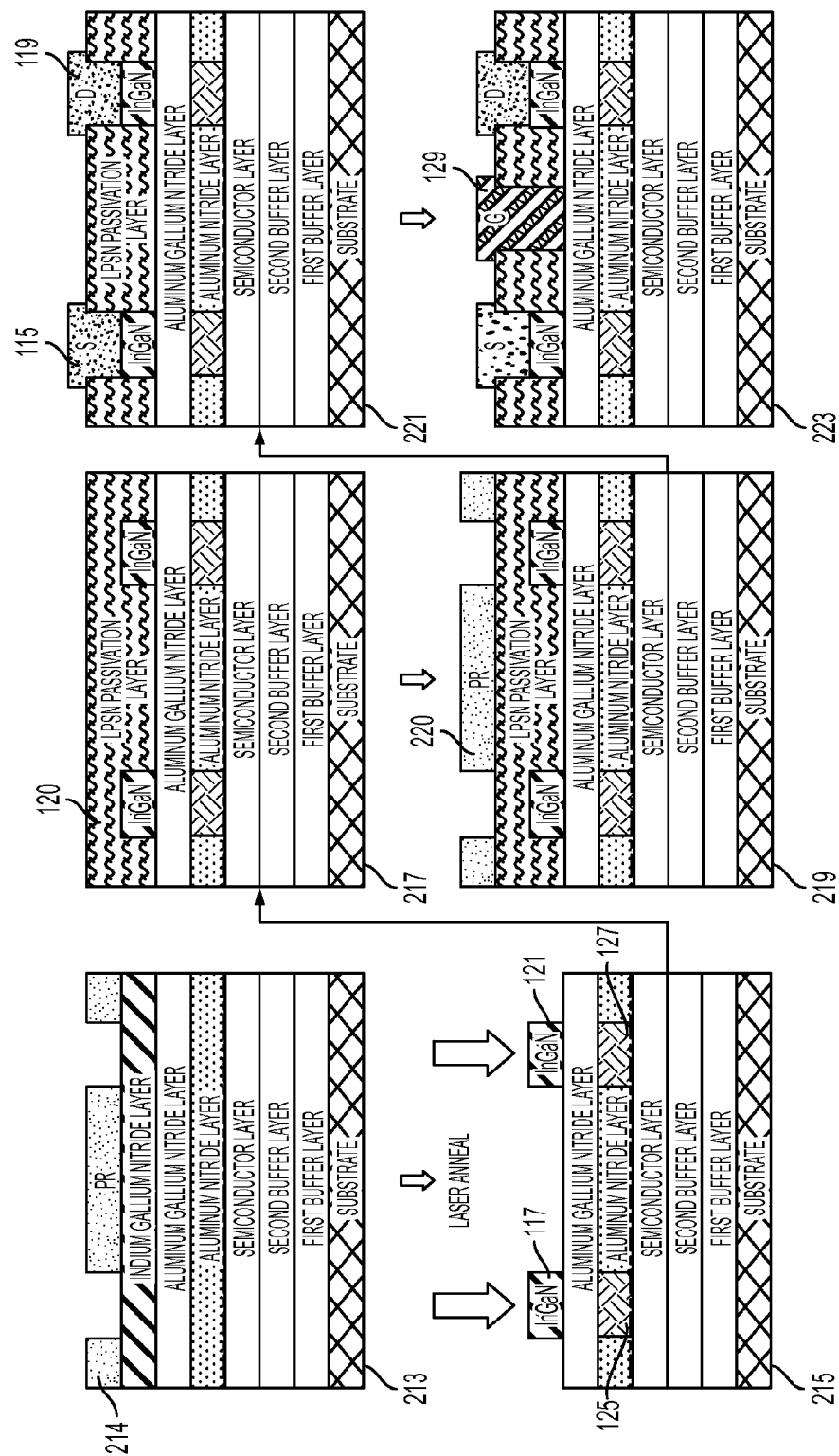

FIGS. 2a and 2b are process diagrams of a method 200 of manufacturing a semiconductor device such as semiconductor device 100 (FIG. 1), in accordance with one or more embodiments.

Method 200 starts in FIG. 2a with step 201 in which the first buffer layer 103 is deposited over the substrate 101 by a physical vapor deposition process (PVD), chemical vapor deposition process (CVD), metalorganic chemical vapor deposition process (MOCVD), an epitaxial growth process, a plating process, or other suitable process. In step 203, the second buffer layer 105 is deposited over the first buffer layer 103 by a PVD process, a CVD process, a MOCVD process, an epitaxial growth process, a plating process, or other suitable process. In step 205, the semiconductor layer 107 is deposited over the second buffer layer 105 by a PVD process, a CVD process, a MOCVD process, an epitaxial growth process, a plating process, or other suitable process. In step 207, the aluminum nitride layer 109 is deposited over the semiconductor layer 107 by a PVD process, a CVD process, a MOCVD process, an epitaxial growth process, a plating process, or other suitable process. In step 209, the aluminum gallium nitride layer 111 is deposited over the aluminum nitride layer 109 by a PVD process, a CVD process, a MOCVD process, an epitaxial growth process, a plating process, or other suitable process. In step 211, the indium gallium nitride layer 113 is deposited over the aluminum gallium nitride layer 111 by a PVD process, a CVD process, a MOCVD process, an epitaxial growth process, a plating process, or other suitable process.

Method 200 continues to FIG. 2b with step 213, in which a first patterned photo resist 214 is deposited or applied over the indium gallium nitride layer 113 and some of the indium gallium nitride layer 113 is removed by, for example, a lithography or etching process, leaving the first portion 117 of the indium gallium nitride layer 113 and the second portion 121 of the indium gallium nitride layer 113.

In step 215, an aluminum content of at least the aluminum nitride layer 109 is reduced by drawing aluminum atoms from the aluminum nitride layer 109 into at least the aluminum gallium nitride layer 111 beneath the first portion 117 and the second portion 121 of the indium gallium nitride layer 113. In some embodiments, the aluminum content of the aluminum nitride layer 109 is reduced by laser annealing at least the first portion 117 and the second portion 121 of the indium gallium nitride layer 113. Additionally, in step 215, at least some indium atoms from the indium gallium nitride layer 113 are driven into at least the aluminum gallium nitride layer 111 beneath the first portion 117 and the second portion 121 of the indium gallium nitride layer 113.

In step 217, the passivation layer 120 is deposited over the aluminum gallium nitride layer 111, the first portion 117 of the indium gallium nitride layer 113, and the second portion 121 of the indium gallium nitride layer 113 by a PVD process, a CVD process, a MOCVD process, an epitaxial growth process, a plating process, or other suitable process.

In step 219, a second patterned photo resist 220 is deposited or applied over the passivation layer 120, and portions of the passivation layer 120 over the first portion 117 of the indium gallium nitride layer 113 and the second portion 121 of the indium gallium nitride layer 113 are removed by a lithography or etching process.

In step 221, source contact 115 is deposited over the first portion 117 of the indium gallium nitride layer 113 and drain contact 119 is deposited over the second portion 121 of the indium gallium nitride layer 113 within a space that remains following removal of the portions of the passivation layer 120 in step 219. The source contact 115 and the drain contact 119 are deposited by a PVD process, a CVD process, a MOCVD process, an epitaxial growth process, a plating process, or other suitable process.

In step 223, another portion of the passivation layer 120 is removed between the first portion 117 of the indium gallium nitride layer 113 and the second portion 121 of the indium gallium nitride layer 113 exposing the aluminum gallium nitride layer 111. The gate contact 123 is then deposited within a gap that remains following removal of the another portion of the passivation layer 120 such that the gate contact 123 is over the aluminum gallium nitride layer 111 between the source contact 115 and the drain contact 119.

Optionally, in one or more of step 221 or step 223, at least some atoms of at least one ohmic metal in the source contact 115 and the drain contact 119 into at least the aluminum gallium nitride layer 111 annealing the source contact 115 and the drain contact 119. In some embodiments, the annealing of the source contact 115 and the drain contact 119 is an alloy annealing process that is conducted for about 30 to about 90 seconds at a temperature ranging between about 700° C. and about 900° C. In some embodiments, the alloy annealing process is conducted for about 60 seconds at a temperature greater than about 800° C. or about 850° C. In some embodiments, the source contact 115 and/or the drain contact 119 are laser annealed.

One aspect of this description relates to a method comprising depositing a first layer comprising aluminum nitride over a substrate. The method further comprises depositing a second layer comprising aluminum gallium nitride over the first layer. The method also comprises depositing a third layer comprising indium gallium nitride over the second layer. The method additionally comprises removing some of the third layer leaving a first portion of the third layer and a second portion of the third layer. The method further comprises reducing an aluminum content of at least the first layer by drawing aluminum atoms from the first layer into at least the second layer beneath the first portion and the second portion of the third layer. The method also comprises depositing a source contact over the first portion of the third layer and a drain contact over the second portion of the third layer.

Another aspect of this description relates to a semiconductor device comprising a substrate, a first layer comprising aluminum nitride over the substrate, a second layer comprising aluminum gallium nitride over the first layer, and a third layer comprising indium gallium nitride over the second layer. The third layer has a first portion and a second portion. The first portion of the third layer is separated from the second portion of the third layer by a spacing.

The semiconductor device also comprises a first blended region beneath the first portion of the third layer. The first blended region comprises aluminum atoms drawn from the first layer into at least the second layer. The semiconductor device further comprises a second blended region beneath the second portion of the third layer. The second blended region comprises aluminum atoms drawn from the first layer into at least the second layer. The semiconductor device additionally comprises a source contact over the first portion of the third layer, and a drain contact over the second portion of the third layer.

Still another aspect of this description relates to method comprising depositing at least one buffer layer over a substrate. The method also comprises depositing at least one gallium nitride layer over the at least one buffer layer. The method further comprises depositing a first layer comprising aluminum nitride over the at least one gallium nitride layer. The method additionally comprises depositing a second layer comprising aluminum gallium nitride over the first layer.

The method also comprises depositing a third layer comprising indium gallium nitride over the second layer. The method further comprises removing some of the third layer leaving a first portion of the third layer and a second portion of the third layer. The method additionally comprises laser annealing at least the first portion of the third layer and the second portion of the third layer, thereby reducing an effective thickness of the first layer by reducing an aluminum content of at least the first layer, the aluminum content of the first layer being reduced by drawing aluminum atoms from the first layer into at least the second layer beneath the first portion and the second portion of the third layer.

The method also comprises depositing a passivation layer over the third layer. The method further comprises removing portions of the passivation layer over the first portion of the third layer and the second portion of the third layer. The method additionally comprises depositing a source contact over the first portion of the third layer and a drain contact over the second portion of the third layer within a space that remains following removal of the portions of the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a high electron mobility transistor, the method comprising:
   depositing a first layer comprising aluminum nitride over a substrate;
   depositing a second layer comprising aluminum gallium nitride over the first layer;
   depositing a third layer comprising indium gallium nitride over the second layer;
   removing some of the third layer leaving a first portion of the third layer and a second portion of the third layer;
   reducing an aluminum content of at least the first layer by drawing aluminum atoms from the first layer into at least the second layer beneath the first portion and the second portion of the third layer; and
   depositing a source contact over the first portion of the third layer and a drain contact over the second portion of the third layer.

2. The method of claim 1, wherein the aluminum atoms are drawn from the first layer into the second layer beneath the first portion and the second portion of the third layer by laser annealing at least the first portion and the second portion of the third layer.

3. The method of claim 1, wherein the third layer is deposited having between about 5% and about 20% indium.

4. The method of claim 1, wherein the first layer is deposited over at least one layer having 0% aluminum content.

5. The method of claim 1, wherein the first layer is deposited having a first thickness ranging between about 1 nm and about 5 nm, the second layer is deposited having a second thickness ranging between about 15 nm and about 30 nm, and the third layer is deposited having a third thickness ranging between about 1 nm and about 5 nm.

6. The method of claim 1, wherein the second layer is deposited having between about 15% and about 35% aluminum.

7. The method of claim 1, wherein depositing the source contact and the drain contact comprises depositing an ohmic metal.

8. The method of claim 7, further comprising:
driving at least some atoms of at least one ohmic metal in the source contact and the drain contact into at least the second layer by laser annealing the source contact and the drain contact.

9. The method of claim 8, wherein the at least one ohmic metal having atoms driven into the second layer comprises titanium.

10. The method of claim 1, further comprising:
driving at least some indium atoms from the third layer into at least the second layer beneath the first portion and the second portion of the third layer.

11. A method of manufacturing a high mobility electron transistor, the method comprising:
depositing at least one buffer layer over a substrate;
depositing at least one gallium nitride layer over the at least one buffer layer;
depositing a first layer comprising aluminum nitride over the at least one gallium nitride layer;
depositing a second layer comprising aluminum gallium nitride over the first layer;
depositing a third layer comprising indium gallium nitride over the second layer;
removing some of the third layer leaving a first portion of the third layer and a second portion of the third layer;
laser annealing at least the first portion of the third layer and the second portion of the third layer, thereby reducing an effective thickness of the first layer by reducing an aluminum content of at least the first layer, the aluminum content of the first layer being reduced by drawing aluminum atoms from the first layer into at least the second layer beneath the first portion and the second portion of the third layer;
depositing a passivation layer over the third layer;
removing portions of the passivation layer over the first portion of the third layer and the second portion of the third layer; and
depositing a source contact over the first portion of the third layer and a drain contact over the second portion of the third layer within a space that remains following removal of the portions of the passivation layer.

12. The method of claim 11, further comprising:
removing another portion of the passivation layer between the first portion of the third layer and the second portion of the third layer exposing the second layer; and
depositing a gate contact within a gap that remains following removal of the another portion of the passivation layer, the gate contact being over the second layer between the source contact and the drain contact.

13. The method of claim 11, further comprising:
depositing a resist layer over the third layer before removing some of the third layer to form the first portion and the second portion of the third layer,
wherein the first portion and the second portion of the third layer are positioned over the second layer in accordance with a pattern in the resist layer.

14. The method of claim 11, further comprising:
depositing a resist layer over the passivation layer, the resist layer having a pattern corresponding to a position of the first portion of the third layer and the second portion of the third layer,
wherein removing the portions of the passivation layer over the first portion and the second portion of the third layer exposes the first portion and the second portion of the third layer.

15. The method of claim 11, wherein the source contact and the drain contact are formed in direct physical contact with the first portion and the second portion of the third layer.

16. The method of claim 11, further comprising:
annealing the source contact and the drain contact to drive at least some atoms of a metal of the source contact and at least some atoms of a metal of the drain contact into at least the second layer.

17. The method of 16, wherein the source contact and the drain contact are annealed for about 30 seconds to about 90 seconds at a temperature of about 700° C. to about 900° C.

18. A method, comprising:
annealing a patterned indium gallium nitride layer to reduce an aluminum content of an aluminum nitride layer beneath the patterned indium gallium nitride layer,
wherein an aluminum gallium nitride layer is between the patterned indium gallium nitride layer and the aluminum nitride layer, and annealing the patterned indium gallium nitride layer causes aluminum atoms of the aluminum nitride layer to be drawn into the aluminum gallium nitride layer, forming a pattern in the aluminum nitride layer.

19. The method of claim 18, wherein the pattern in the aluminum nitride layer is formed comprising at least two portions substantially aligned with the patterned indium gallium nitride layer, and the two portions substantially aligned with the patterned indium gallium nitride layer are caused to have an effective thickness less than an initial effective thickness before the annealing.

20. The method of claim 19, further comprising:
depositing a source contact over a first portion of the patterned indium gallium nitride layer;
depositing a drain contact over a second portion of the patterned indium gallium nitride layer; and
depositing a gate contact over the aluminum gallium nitride layer.

* * * * *